US012792169B2

(12) United States Patent
Han et al.

(10) Patent No.: US 12,792,169 B2
(45) Date of Patent: Nov. 10, 2026

(54) DISPLAY APPARATUS

(71) Applicant: LG Display Co., Ltd., Seoul (KR)

(72) Inventors: Jonghyun Han, Seoul (KR); Younggyu Moon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/797,171

(22) Filed: Aug. 7, 2024

(65) Prior Publication Data

US 2025/0271954 A1 Aug. 28, 2025

(30) Foreign Application Priority Data

Feb. 27, 2024 (KR) ........................ 10-2024-0028185

(51) Int. Cl.

*G06F 3/041* (2006.01)
*G06F 3/044* (2006.01)
*H10K 59/122* (2023.01)
*H10K 59/40* (2023.01)
*H10K 59/80* (2023.01)

(52) U.S. Cl.

CPC .......... *G06F 3/0412* (2013.01); *G06F 3/0446* (2019.05); *H10K 59/122* (2023.02); *H10K 59/40* (2023.02); *H10K 59/8792* (2023.02); *G06F 2203/04111* (2013.01); *G06F 2203/04112* (2013.01)

(58) Field of Classification Search

CPC ................. G06F 3/0412; G06F 3/0446; G06F 2203/04111; G06F 2203/04112; G06F 3/0443; H10K 59/40; H10K 59/122; H10K 59/8792; H10K 59/12; H10K 59/35; H10K 59/38; H10K 59/873

See application file for complete search history.

(56) References Cited

U.S. PATENT DOCUMENTS

2017/0344141 A1* 11/2017 Lee ........................ G06F 3/0446
2018/0348937 A1* 12/2018 Pak ........................ G06F 3/0446

(Continued)

FOREIGN PATENT DOCUMENTS

CN 113360024 A 9/2021
JP 2020194154 A 12/2020

(Continued)

*Primary Examiner* — Robin J Mishler

(74) *Attorney, Agent, or Firm* — Seed Intellectual Property Law LLP

(57) ABSTRACT

Disclosed is a display apparatus that includes a substrate having a display area and a non-display area adjacent to the display area. The display apparatus includes a light emitting element layer disposed on the substrate in the display area. The display apparatus includes an encapsulation layer disposed on the light emitting element layer. The display apparatus includes a touch sensing layer disposed on the encapsulation layer. The display apparatus includes a color filter layer disposed on the touch sensing layer. The display apparatus includes a gate driving circuit provided on the substrate in the non-display area. The display apparatus includes a dam disposed on the substrate in the non-display area and around the display area. The display apparatus includes a panel crack detector disposed at an edge portion of the substrate in the non-display area. The dam is located between the gate driving circuit and the panel crack detector.

17 Claims, 10 Drawing Sheets

(56) References Cited

U.S. PATENT DOCUMENTS

| | | | | |
|---|---|---|---|---|
| 2020/0212356 | A1 | 7/2020 | Kim et al. | |
| 2021/0064188 | A1 | 3/2021 | Lee et al. | |
| 2021/0200361 | A1 | 7/2021 | Park et al. | |
| 2021/0202668 | A1 | 7/2021 | Kwon et al. | |
| 2021/0399262 | A1 | 12/2021 | Woo et al. | |
| 2022/0199715 | A1* | 6/2022 | Kim | H10K 59/879 |
| 2022/0206620 | A1* | 6/2022 | Lee | G06F 3/0412 |
| 2023/0056178 | A1* | 2/2023 | Lius | G06F 3/0412 |
| 2023/0056594 | A1* | 2/2023 | Shin | H10K 50/865 |
| 2023/0189586 | A1 | 6/2023 | Jung | |
| 2023/0252923 | A1 | 8/2023 | Lee et al. | |
| 2023/0284495 | A1 | 9/2023 | Kim | |
| 2024/0040850 | A1 | 2/2024 | Shin | |
| 2024/0074265 | A1 | 2/2024 | Jeong et al. | |
| 2024/0160306 | A1* | 5/2024 | Luo | G06F 3/0446 |
| 2024/0276844 | A1* | 8/2024 | Tong | H10K 59/40 |

FOREIGN PATENT DOCUMENTS

| | | | |
|---|---|---|---|
| KR | 102461758 | B1 | 10/2022 |
| KR | 20230089837 | A | 6/2023 |
| KR | 10-2024-0061193 | A | 5/2024 |
| KR | 10-2024-0102425 | A | 7/2024 |
| KR | 10-2024-0120206 | A | 8/2024 |

* cited by examiner

DISPLAY APPARATUS

CROSS-REFERENCE TO RELATED APPLICATIONS

This application claims the priority of Korean Patent Application No. 10-2024-0028185 filed on Feb. 27, 2024, in the Korean Intellectual Property Office, the disclosure of which is incorporated herein by reference.

BACKGROUND

Technical Field

The present disclosure relates to a display apparatus, and more particularly, to a display apparatus including a touch electrode.

Description of the Related Art

As it enters the information era, a field of a display apparatus which visually expresses electrical information signals has been rapidly developed and studies are continued to improve performances of various display apparatuses, such as reduced thickness, weight lightening, and low power consumption.

Examples of such display apparatuses may include a liquid crystal display (LCD), an electro-wetting display (EWD), an organic light emitting display (OLED), and the like.

Among various display apparatuses, an electroluminescent display apparatus is a self-emitting display apparatus so that a separate light source is not necessary unlike the LCD. Therefore, the electroluminescent display apparatus may be manufactured to have weight lightening and reduced thickness. Since the electroluminescent display apparatus is driven at a low voltage, it is advantageous not only in terms of power consumption, but also in terms of color implementation, a response speed, a viewing angle, a contrast ratio (CR). Therefore, it is expected to be utilized in various fields.

In order to provide various functions to users, a touch display apparatus provides a touch sensing function for recognizing a finger touch or a pen touch on the display panel and performing an input process based on the recognized touch.

BRIEF SUMMARY

Various embodiments of the present disclosure provide a display apparatus which has an improved degree of freedom in disposition of touch electrodes.

Various embodiments of the present disclosure provide a display apparatus which has an enhanced touch sensing performance.

Technical benefits of the exemplary embodiment of the present disclosure are not limited to the above-mentioned benefits, and other benefits, which are not mentioned above, can be clearly understood by those skilled in the art from the following descriptions.

Other detailed matters of the exemplary embodiments are included in the detailed description and the drawings.

In the display apparatus according to an exemplary embodiment of the present disclosure, a touch sensing unit is disposed between an encapsulation layer and a color filter layer. Also, touch electrodes of the touch sensing unit are disposed under a black matrix of the color filter layer.

Therefore, it is possible to improve the degree of freedom in disposition of the touch electrodes.

In the display apparatus according to an exemplary embodiment of the present disclosure, a touch electrode line of the touch electrode is increased in width within a width of the black matrix. Thus, a high metal density can be achieved. Therefore, it is possible to enhance a touch sensing performance.

In the display apparatus according to an exemplary embodiment of the present disclosure, a bridge electrode having a relatively lower metal density than the touch electrode is disposed on the touch electrodes. Thus, it is possible to suppress the occurrence of arcs between an inorganic layer covering the touch sensing unit and the touch electrodes. Therefore, it is possible to stably enhance the touch sensing performance.

In the display apparatus according to an exemplary embodiment of the present disclosure, a dummy electrode is locally disposed on the touch electrodes. Therefore, it is possible to enhance the touch sensing performance.

The effects of the present disclosure are not limited to the aforementioned effects, and other effects, which are not mentioned above, will be apparently understood to a person having ordinary skill in the art from the following description.

The objects to be achieved by the present disclosure, the means for achieving the objects, and the effects of the present disclosure described above do not specify essential features of the claims, and, thus, the scope of the claims is not limited to the disclosure of the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
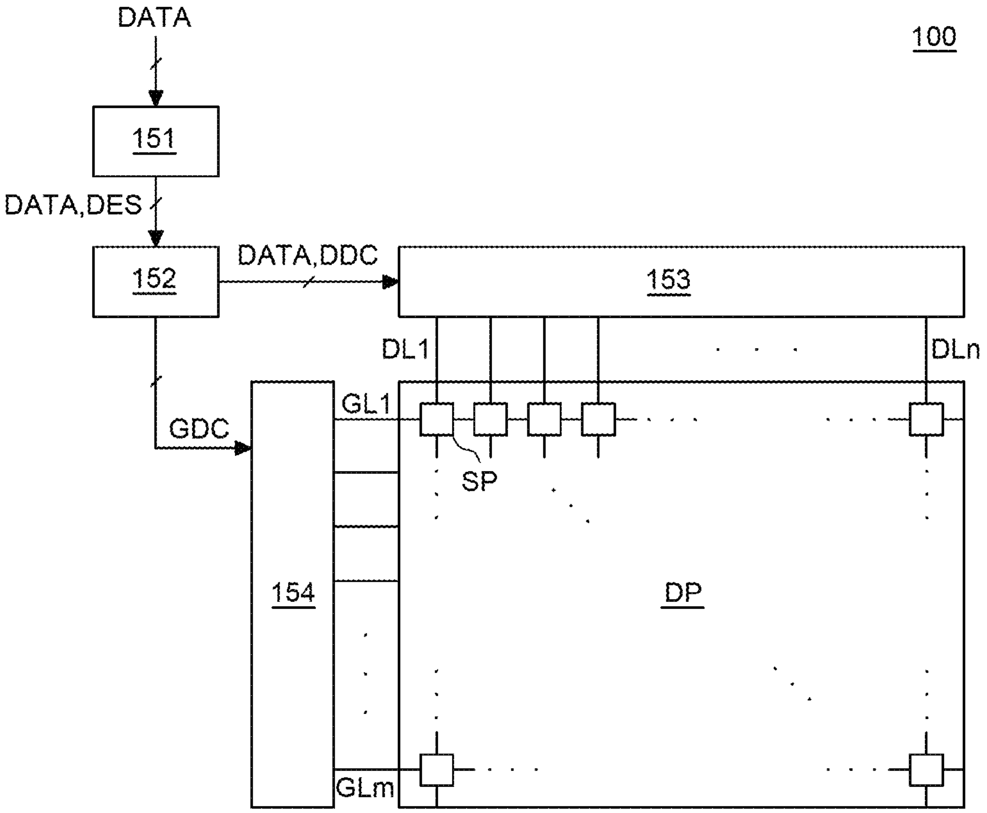
FIG. 1 is a block diagram of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, numbers, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly" is not used.

When an element or layer is referred to as being "on" another element or layer, it may be directly on the other element or layer, or intervening elements or layers may be present therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure. Like reference numerals generally denote like elements throughout the specification.

The term "unit" may include any electrical circuitry, features, components, an assembly of electronic components or the like. That is, "unit" may include any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit or processor capable of executing the various operations and functions described herein. The above examples are examples only, and are thus not intended to limit in any way the definition or meaning of the term "unit."

In some embodiments, the various units described herein may be included in or otherwise implemented by processing circuitry such as a microprocessor, microcontroller, or the like.

The features of various embodiments of the present disclosure can be partially or entirely coupled to or combined with each other and can be interlocked and operated in technically various ways, and respective embodiments can be carried out independently of or in association with each other.

Other detailed matters of the exemplary embodiments are included in the detailed description and the drawings.

FIG. 1 is a block diagram of a display apparatus according to an exemplary embodiment of the present disclosure.

Figure 2:
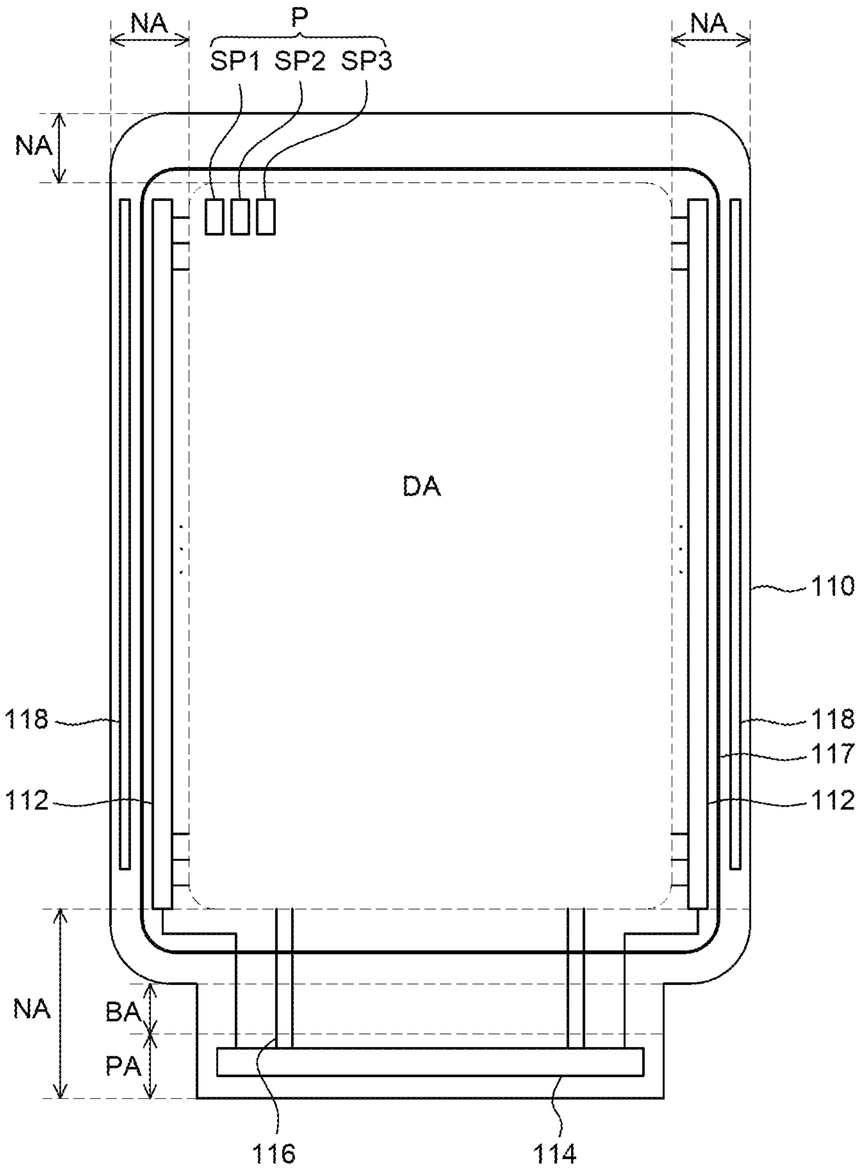
FIG. 2 is a plan view of a display panel according to an exemplary embodiment of the present disclosure.

FIG. 2 is a plan view of a display panel according to an exemplary embodiment of the present disclosure.

Referring to FIG. 1 and FIG. 2, a display apparatus 100 according to an exemplary embodiment of the present disclosure may include an image processor 151, a timing controller 152, a data driver 153, a gate driver 154, and a display panel DP.

The image processor 151 outputs driving signals including a data signal DATA supplied from the outside and a data enable signal DES. The image processor 151 may output driving signals including one or more of a vertical synchronization signal, a horizontal synchronization signal, and a clock signal in addition to the data enable signal DES.

The timing controller 152 is supplied with the data signal DATA together with a driving signal including the data enable signal DES from the image processor 151. The timing controller 152 outputs a gate timing control signal GDC for controlling an operation timing of the gate driver 154 based on the driving signal. The timing controller 152 outputs the data signal DATA supplied from the image processor 151 and a data timing control signal DDC for controlling an operation timing of the data driver 153.

The data driver 153 samples and latches the data signal DATA supplied from the timing controller 152 in response to the data timing control signal DDC supplied from the timing controller 152. Then, the data driver 153 converts the data signal into a gamma reference voltage and outputs the converted gamma reference voltage. The data driver 153 outputs the data signal DATA through data lines DL1 to DLn.

The gate driver 154 may output a gate signal while shifting a level of a gate voltage, in response to the gate timing control signal GDC supplied from the timing controller 152. Also, the gate driver 154 outputs the gate signal through gate lines GL1 to GLm.

To provide a touch sensing function, the display apparatus 100 according to the exemplary embodiment of the present disclosure may also include a touch sensing unit including a plurality of touch electrodes. Further, the display apparatus 100 may include a touch sensing circuit supplying a touch driving signal to the touch sensing unit, detecting a touch sensing signal from the touch sensing unit, and sensing the presence of a user's touch and a touched position (or coordinates).

For example, the touch sensing circuit may include a touch driving circuit configured to supply the touch driving signal to the touch sensing unit and detect the touch sensing signal from the touch sensing unit. Also, the touch sensing circuit may include a touch controller configured to sense the presence of the user's touch and/or the touched position based on the touch sensing signal detected by the touch driving circuit. The touch driving circuit and the touch controller may be implemented as separate components or integrated into a single component when needed.

Meanwhile, each of the data driver 153, the gate driver 154, and the touch driving circuit may be implemented as one or more integrated circuits. In view of electrical connection with the display panel DP, each of the data driver 153, the gate driver 154, and the touch driving circuit may be implemented by a COG (chip on glass) type, a COF (chip on film) type, a TCP (tape carrier package) type, or the like.

Further, each of the timing controller 152, the data driver 153 and the gate driver 154 for display driving and circuit elements for touch sensing may be implemented as one or more individual components. In some cases, at least one of the elements 152, 153 and 154 for display driving and at least one of the circuit elements for touch sensing may be functionally integrated into one or more components. For example, the data driver 153 and the touch driving circuit may be integrated into one or more integrated circuit chips. In the case where the data driver 153 and the touch driving circuit are integrated into two or more integrated circuit chips, each of the two or more integrated circuit chips may have a data driving function and a touch driving function.

The display panel DP may include a plurality of pixels P. Each of the plurality of pixels P emits light in response to data signals and gate signals supplied from the data driver 153 and the gate driver 154 to display images.

Each pixel P may be composed of a plurality of sub pixels SP. For example, each pixel P may include three or more sub pixels SP configured to emit light of different colors in different wavelength ranges. For example, in the display apparatus 100 according to the exemplary embodiment of the present disclosure, each pixel P may include sub pixels SP that emit red light, green light, and blue light, respectively. However, the number of sub pixels SP included in each pixel P is not limited. For example, each pixel SP may further include a sub pixel SP that emits white light in addition to the sub pixels SP that emit red light, green light, and blue light, respectively.

A plurality of gate lines GL1 to GLm extending in a first direction and a plurality of data lines DL1 to DLn extending in a second direction different from the first direction are disposed on the display panel DP to intersect each other. Sub pixels SP are defined at respective intersections of the plurality of gate lines and the plurality of data lines on the display panel DP.

Referring to FIG. 2, the display panel DP includes a substrate 110.

The substrate 110 is a component for supporting various components included in the display apparatus 100. The substrate 110 may be made of an insulating material. Also, the substrate 110 may be made of a transparent material. Further, the substrate 110 may be a rigid substrate, or a flexible substrate capable of being bent, folded, rolled, and the like. The substrate 110 may be made of glass, or a plastic material having flexibility. For example, when the substrate 110 is made of polyimide (PI) which is a plastic material, a manufacturing process of the display apparatus 100 is performed in a state where a support substrate made of glass is disposed under the substrate 110. After the manufacturing process of the display apparatus 100 is completed, the support substrate may be released.

As shown in FIG. 2, the substrate 110 of the display panel DP may include a display area DA and a non-display area NA which is disposed outside the display area DA and in which the plurality of pixels P is not disposed. The non-display area NA is adjacent to the display area DA, and may be disposed at an outer portion more than the display area DA.

The display area DA of the substrate 110 may refer to an area in which pixels P are disposed and images are displayed. In the display area DA, a plurality of sub pixels SP1, SP2, and SP3 may be disposed, and the plurality of sub pixels SP1, SP2, and SP3 may constitute a pixel P.

The non-display area NA of the substrate 110 may include a peripheral area enclosing the display area DA, a bending area BA extending and bending from one side of the peripheral area, and a pad area PA extending from the bending area BA. FIG. 2 illustrates a state before the substrate 110 is bent.

The non-display area NA of the substrate 110 refers to an area in which various wiring lines and circuits for driving the sub pixels SP1, SP2, and SP3 disposed in the display area DA are disposed. The non-display area NA is an area in which no image is displayed, and, thus, it does not need to be seen from the front side of the display panel DP. Therefore, a partial area of the non-display area NA of the substrate 110 may be bent toward a rear surface of the display panel DP. For example, an edge of the substrate 110 may be bent in a rear direction of the display panel DP to have a predetermined curvature. In this case, the pad area PA may be located to overlap the display area DA on the rear surface of the display panel DP. Accordingly, it is possible to ensure an area for the wiring lines and driving circuits and reduce the non-display area NA.

A pad unit 114 may be disposed in the pad area PA of the substrate 110. The pad unit 114 may be a metal pattern to which an external module, for example, a flexible printed circuit board (FPCB) and a chip on film (COF) are bonded. Although FIG. 2 illustrates that the pad unit 114 is disposed on one side of the non-display area NA, the shape and disposition of the pad unit 114 are not limited thereto.

Also, a connection line 116 may be disposed in a part of the non-display area NA of the substrate 110. For example, the connection line 116 may be disposed in a part of the peripheral area of the substrate 110 which is adjacent to the bending area BA.

The connection line 116 may transmit a signal (for example, voltage) from the external module bonded to the pad unit 114 to the display area DA or a circuit unit, such as a gate driving unit 112 included in the gate driver 154. The gate driving unit 112 supplies a gate signal to a thin film transistor of a pixel driving circuit and includes various gate driving circuits. In the display apparatus 100 according to the exemplary embodiment of the present disclosure, the gate driving unit 112 may be provided in a gate-in-panel (GIP) structure in which the gate driving circuits are directly provided on the substrate 110.

Various signals and voltages, such as gate signals, data signals, high potential voltages, and low potential voltages, may be transmitted through the connection line 116. The connection line 116 may be classified as a power connection line and/or a signal connection line depending on a voltage and/or a signal to be transmitted. The power connection line may transmit a voltage supplied from the external module to the display area DA. The power connection line may be connected to a low potential voltage line VSS, a high potential voltage line VDD, and a gate low voltage line and/or a gate high voltage line included in the gate driving unit 112 but is not limited thereto. Also, the signal connection line may transmit a signal for image display supplied from the external module to the display area DA. The signal connection line may be connected to a gate line and/or a data line but is not limited thereto.

A dam 117 may be disposed in the non-display area NA of the substrate 110 to enclose all or a part of the display area DA. The dam 117 is adjacent to the display area DA, and may be disposed at an outer portion more than the display area DA. The dam 117 may be disposed along the circumference of the display area DA to control the flow of a layer containing an organic material in an encapsulation layer disposed on a light emitting element. There may be one or more than one dam 117.

A panel crack detector 118 may be further disposed in a part of the non-display area NA of the substrate 110. The panel crack detector 118 may be disposed between an end point of the substrate 110 and the dam 117. The panel crack detector 118 may also be disposed under the dam 117 so as to overlap at least a part of the dam 117. The panel crack detector 118 may be disposed at an outer periphery of the display apparatus 100 to detect defects, such as cracks, which may occur in an outer peripheral portion. For example, the panel crack detector 118 may be composed of at least one crack detection line 118. For example, the crack detection line 118 may be disposed on the gate insulating layer 130 described in FIG. 5 below, and may be made of the same material as the gate electrode 330 of the thin film transistor 300 described in FIG. 5 below. However, the position and material of the crack detection line 118 are not limited thereto. In FIG. 2, it is illustrated that one crack detection wire 118 is arranged on each of both sides of the substrate 110, but the number of crack detection wires 118 is not limited thereto. The crack detection line 118 may be connected to a driving integrated circuit (IC) disposed in the pad area PA or mounted on the FPCB. For example, one end of the crack detection line 118 may be connected to a crack detection pad, and the crack detection pad may be connected to the driving IC. The crack detection pad may be at least one of a plurality of metal patterns included in the pad unit 114. For example, the driving IC can detect whether a crack occurs in the crack detection line 118 based on resistance value changed when a crack occurs in the crack detection line. Accordingly, connection line 116 including at least one line can be protected by the crack detector 118, and thus possible to minimize or reduce a defect rate of the display apparatus, thereby improving reliability.

Figure 3:
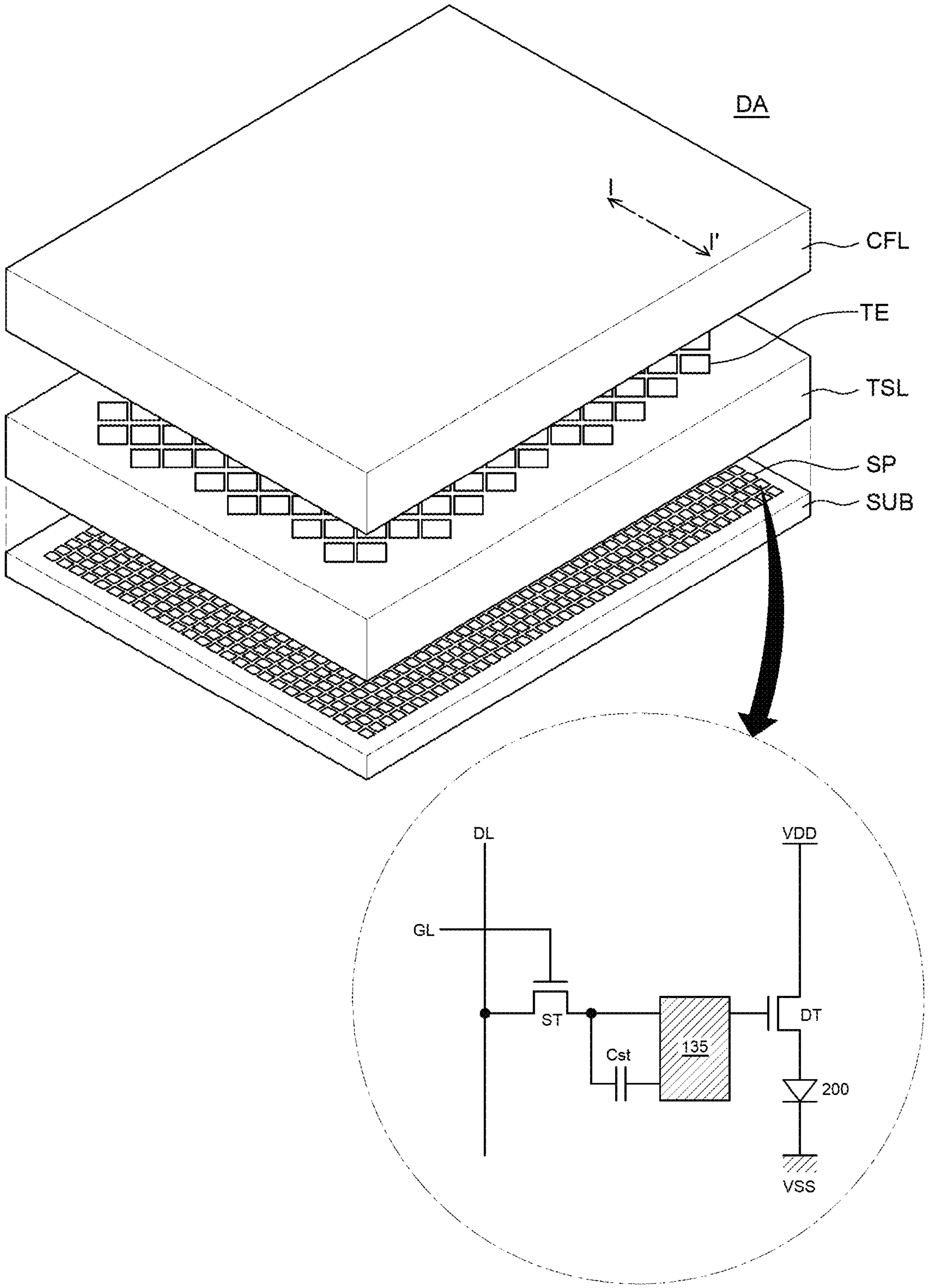
FIG. 3 is an exploded perspective view illustrating a disposition structure of a touch sensing layer in the display apparatus according to an exemplary embodiment of the present disclosure.

FIG. 3 is an exploded perspective view illustrating a disposition structure of a touch sensing layer in the display apparatus according to an exemplary embodiment of the present disclosure.

Referring to FIG. 3, the display apparatus 100 according to the exemplary embodiment of the present disclosure includes a substrate layer SUB including a plurality of sub pixels SP disposed in the display area DA of the substrate 110. Also, the display apparatus 100 includes a touch sensing layer TSL disposed on the substrate layer SUB and including a plurality of touch electrodes TE. Further, the display apparatus 100 includes a color filter layer CFL disposed on the touch sensing layer TSL and including a plurality of color filters and a black matrix disposed between the color filters on the same layer.

The display area DA of the substrate 110 refers to an area in which the plurality of pixels P for implementing images is disposed. Each pixel P may include a plurality of sub pixels SP including a light emitting element 200 and a pixel driving circuit configured to control the amount of current flowing in the light emitting element 200. The pixel driving circuit may include a plurality of driving thin film transistors (TFTs).

In an exemplary embodiment of the present disclosure, it is assumed that the display apparatus 100 is an organic light emitting display apparatus but is not limited thereto. For example, when the display apparatus 100 is an organic light emitting display apparatus, each sub pixel may include the light emitting element 200 including an anode, a light emitting layer on the anode, and a cathode on the light emitting layer. In this case, the light emitting element 200 may include an organic light emitting layer as a light emitting layer. Also, the light emitting element 200 may include a hole transport layer, a hole injection layer, an electron injection layer, and an electron transport layer in addition to the organic light emitting layer. For another example, when the display apparatus 100 is a liquid crystal display apparatus, a display unit may be configured to include a liquid crystal layer.

Referring to FIG. 3, the pixel driving circuit of the sub pixel SP according to an exemplary embodiment of the present disclosure may include a driving transistor DT, a switching transistor ST, and a capacitor Cst. Also, the pixel driving circuit may include a gate line GL, a data line DL, and lines connected to power supplies VDD and VSS to drive pixels.

The light emitting element 200 may emit light depending on a driving current generated by the driving transistor DT. The switching transistor ST may perform a switching operation such that a data signal supplied through the data line DL in response to the gate signal supplied through the gate line GL is stored as a data voltage in the capacitor Cst. The driving transistor DT may operate such that a constant driving current flows between the high potential power supply VDD and the low potential power supply VSS in response to the data voltage stored in the capacitor Cst.

Each sub pixel SP in the display apparatus 100 according to the exemplary embodiment of the present disclosure has been described above as having a 2T(transistor) 1C(capacitor) structure including a switching transistor ST, a driving transistor DT, and a capacitor Cst.

For another example, the sub pixel may further include a compensation circuit 135 as shown in FIG. 3.

The compensation circuit 135 is a circuit for compensating for a threshold voltage, etc., of the driving transistor DT, and may include one or more thin film transistors and capacitors. Herein, the configuration and structure of a compensating thin film transistor and a compensating capacitor are not limited and may be various depending on a compensation method. For example, when the compensation circuit 135 is added to the sub pixel, the sub pixel may be configured in various forms, such as 3T1C, 4T2C, 5T2C, 6T1C, 6T2C, 7T1C, and 7T2C.

Hereinafter, the touch sensing unit of the display apparatus 100 according to the exemplary embodiment of the present disclosure will be described in detail with reference to FIG. 4 to FIG. 7.

Figure 4:
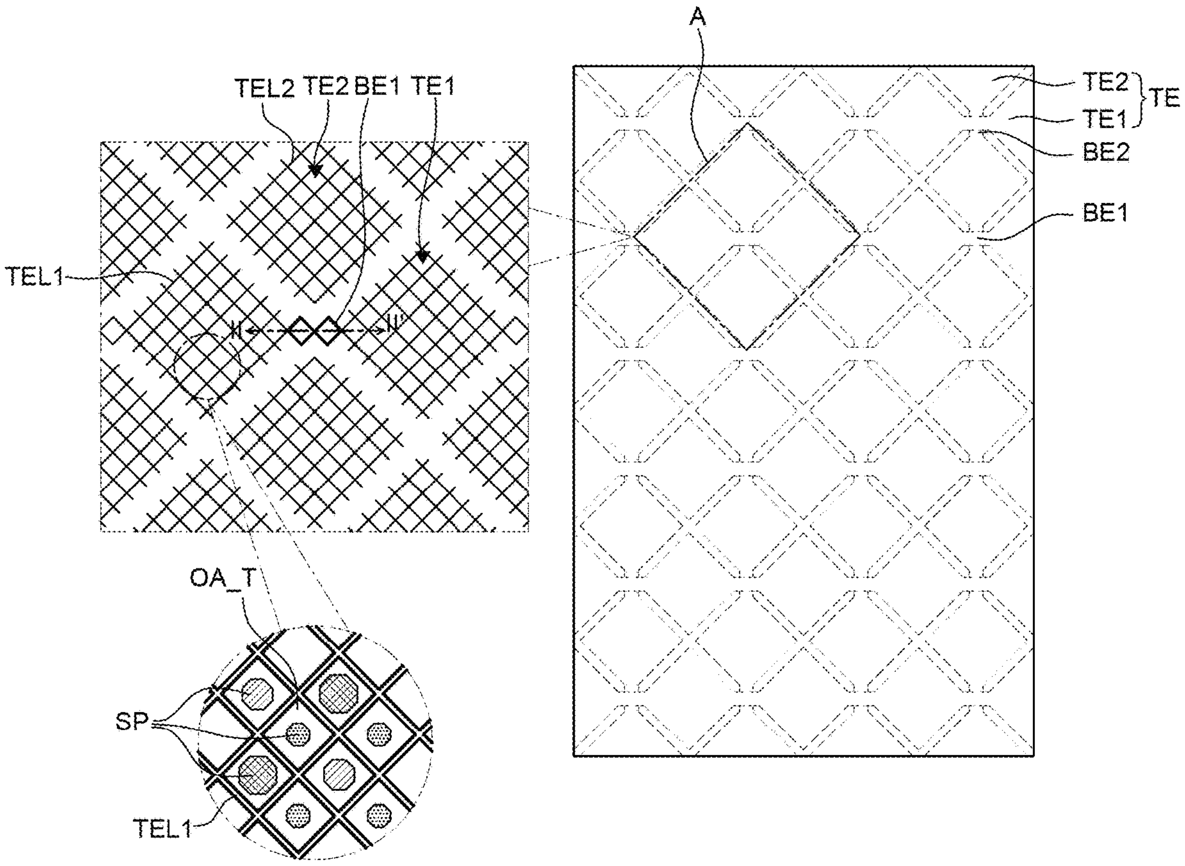
FIG. 4 is a plan view illustrating a structure of a touch sensing unit disposed on the touch sensing layer according to an exemplary embodiment of the present disclosure.
Figure 5:
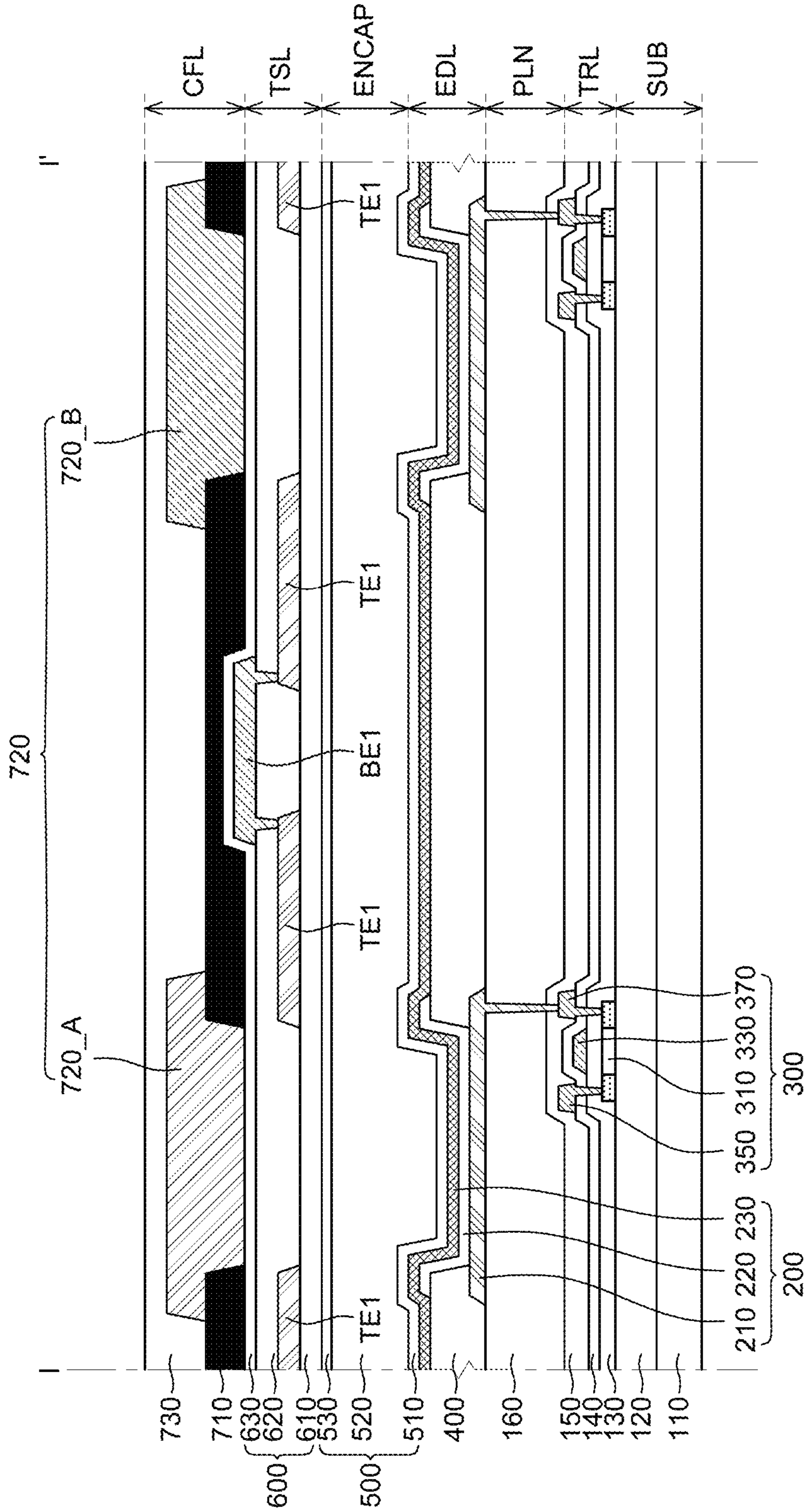
FIG. 5 is a cross-sectional view taken along the line I-I' of FIG. 3.
Figure 6:
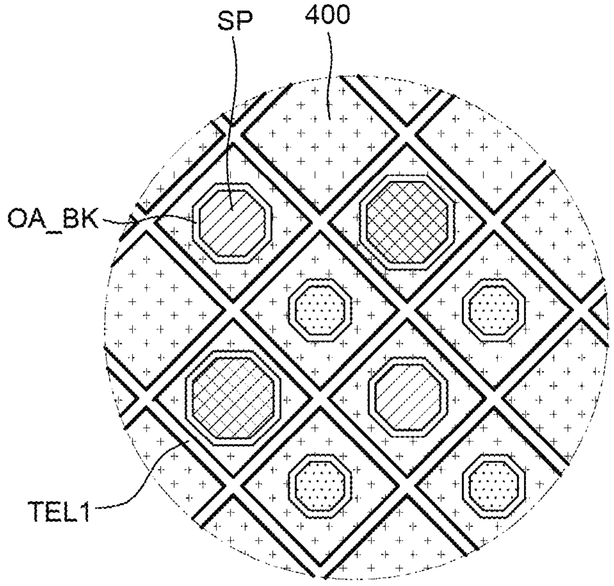
FIG. 6 is a plan view illustrating an overlap structure of a bank and a touch electrode in the display apparatus according to an exemplary embodiment of the present disclosure.
Figure 7:
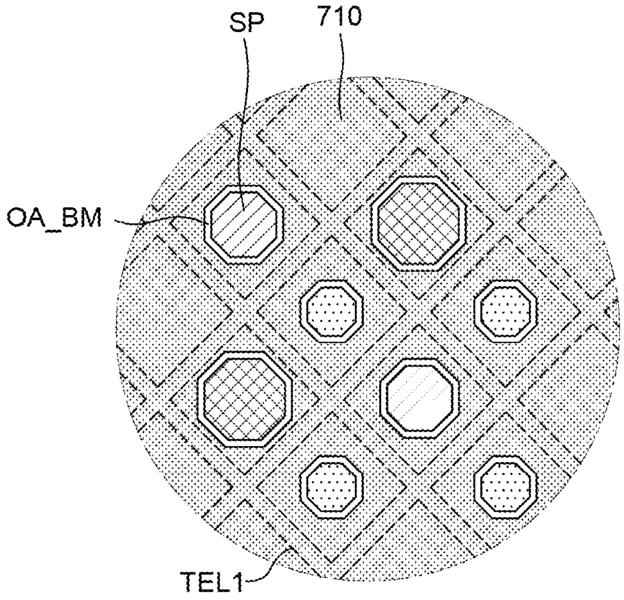
FIG. 7 is a plan view illustrating an overlap structure of a black matrix and a touch electrode in the display apparatus according to an exemplary embodiment of the present disclosure.

FIG. 4 is a plan view illustrating a structure of a touch sensing unit disposed on the touch sensing layer according to an exemplary embodiment of the present disclosure. FIG. 5 is a cross-sectional view taken along the line I-I' of FIG. 3. FIG. 6 is a plan view illustrating an overlap structure of a bank and a touch electrode in the display apparatus according to an exemplary embodiment of the present disclosure. FIG. 7 is a plan view illustrating an overlap structure of a black matrix and a touch electrode in the display apparatus according to an exemplary embodiment of the present disclosure.

Referring to FIG. 4 and FIG. 5, the touch sensing layer TSL is located on an encapsulation layer ENCAP, and the touch sensing unit is disposed in the touch sensing layer TSL. In this case, the touch sensing unit includes the plurality of touch electrodes TE and the plurality of bridge electrodes BE1 and BE2 configured to electrically connect unit electrodes of the plurality of touch electrodes TE.

For example, as shown in FIG. 4, the touch sensing unit includes a plurality of first touch electrodes TE1 each extending in a first direction and a plurality of second touch electrodes TE2 each extending in a second direction which intersects the first direction. Herein, a plurality of first touch routing lines respectively connected to the plurality of first touch electrodes TE1, a plurality of second touch routing lines respectively connected to the plurality of second touch electrodes TE2, and a plurality of touch pads respectively connected to the plurality of first and second touch routing lines may be further disposed on the substrate 110.

Each of the plurality of first touch electrodes TE1 and the plurality of second touch electrodes TE2 may include a plurality of unit electrodes. For example, each of a first touch electrode TE1 and a second touch electrode TE2 may include a plurality of unit electrodes patterned in a mesh form.

FIG. 4 illustrates that the first touch electrode TE1 includes unit electrodes patterned in series in a rhombic mesh form but is not limited thereto. The unit electrodes may be patterned in various shapes, such as a triangular, square, rhombic, or other polygonal shapes. Herein, the unit electrodes of the first touch electrode TE1 and the plurality of second touch electrodes TE2 patterned in a mesh form may include a plurality of first touch electrode line TEL1 and a plurality of second touch electrode line TEL2 enclosing an opening OA_T. The first touch electrode line TEL1 and the second touch electrode line TEL2 serves as a substantial touch electrode where touch driving signals are applied or touch sensing signals are sensed. Each of at least one opening OA_T present in the first touch electrode TE1 may correspond to an emission area of the sub pixel SP. That is, a plurality of openings OA_T serves as a path along which light emitted from the sub pixels SP disposed therebelow emerges. FIG. 4 illustrates an example of the structure of the unit electrodes of the first touch electrode TE1, but the second touch electrode TE2 may also have the same structure.

The display apparatus 100 according to the exemplary embodiment of the present disclosure may sense a touch by a mutual-capacitance scheme or a self-capacitance scheme, as a capacitance-based touch sensing scheme.

In the case of a touch sensing scheme based on mutual-capacitance, the plurality of touch electrodes TE may be classified into touch driving electrodes to which touch driving signals are applied, and touch sensing electrodes on which touch sensing signals are detected and which form capacitances with the touch driving electrodes. For example, the first touch electrodes TE1 may serve as the touch sensing electrodes configured to sense touch sensing signals. In this case, the second touch electrodes TE2 may serve as the touch driving electrodes to which touch driving signals are applied but are not limited thereto. That is, the first touch electrodes TE1 may serve as the touch driving electrodes, and the second touch electrodes TE2 may serve as the touch sensing electrodes.

In the case of a touch sensing scheme based on self-capacitance, the plurality of touch electrodes TE may serve as both the touch driving electrodes and touch sensing electrodes. That is, the touch sensing circuit applies touch driving signals to one or more touch electrodes TE, detects touch sensing signals through the touch electrodes TE to which the touch driving signals are applied, detects a change in capacitance formed between a pointer, such as a finger or a pen, and the touch electrodes TE based on the detected touch sensing signals, and senses the presence of a touch and/or the coordinates of a touch. In the case of the touch sensing scheme based on self-capacitance, the touch driving electrodes and the touch sensing electrodes are not distinguished. For example, each of the plurality of first touch electrodes TE1 and the plurality of second touch electrodes TE2 may serve as both the touch driving electrode and the touch sensing electrode.

Referring to FIG. 4 to FIG. 6 together, the touch electrode line TEL1 of the first touch electrode TE1 may be located on a bank 400 disposed between the sub pixels SP in a non-emission area. As shown in FIG. 6, the bank 400 includes a plurality of openings OA_BK corresponding to emission areas of the plurality of sub pixels SP. Therefore, the opening OA_T of the touch electrode may overlap the opening OA_BK of the bank 400. In an embodiment, in a top view, the sub pixels SP are respectively located in the opening OA_T of the touch electrode. However, as show in FIG. 6, sub pixels SP are not exist in at least some of the opening OA_T in the top view.

Referring to FIG. 4 to FIG. 7 together, the touch electrode line TEL1 of the first touch electrode TE1 may be located under a black matrix 710 disposed between the sub pixels SP in the non-emission area. As shown in FIG. 7, the black matrix 710 includes a plurality of openings OA_BM corresponding to the emission areas of the plurality of sub pixels SP. Therefore, the opening OA_T of the first touch electrode TE1 may overlap the opening OA_BK of the bank 400 and the opening OA_BM of the black matrix 710.

The plurality of sub pixels SP may have different pixel structures from each other. For example, a blue sub pixel, a green sub pixel, and a red sub pixel may have different pixel structures from each other. Since the plurality of sub pixels SP has different pixel structures from each other, the opening OA_BM of the black matrix 710 and the opening OA_BK of the bank 400 may have different shapes for respective emission areas of the blue sub pixel, the green sub pixel, and the red sub pixel. However, the present disclosure is not limited thereto.

An example of the structure of the unit electrodes of the first touch electrode TE1 has been described above, but the second touch electrode TE2 may also have the same structure.

As shown in FIG. 4, the touch sensing unit includes a first bridge electrode BE1 configured to electrically connect the unit electrodes of the first touch electrode TE1. Also, the touch sensing unit includes a second bridge electrode BE2 configured to connect the unit electrodes of the second touch electrode TE2. Herein, the first touch electrode TE1 and the first bridge electrode BE1 are disposed on different layers, and the first bridge electrode BE1 is disposed on an upper layer of the first touch electrode TE1. However, the present disclosure is not limited thereto. In another embodiment, the first bridge electrode BE1 may be disposed under the first touch electrode TE1. In addition, the second touch electrode TE2 and the second bridge electrode BE2 may be disposed on the same layer. For example, the second touch electrode TE2 and the second bridge electrode BE2 may be integrally patterned. In this case, the second bridge electrode may serve to connect an end of any one unit electrode of the second touch electrode TE2 and an end of another unit electrode of the second touch electrode TE2. However, the present disclosure is not limited thereto. In another embodiment, the first touch electrode TE1 and the first bridge electrode BE1 may be disposed on the same layer and may be integrally patterned, and the second touch electrode TE2 and the second bridge electrode BE2 may be disposed on different layers, and the second bridge electrode BE2 may be disposed above/under the second touch electrode TE2.

Hereinafter, a laminated structure of the sub pixel SP, the touch sensing layer TSL, and the color filter layer CFL disposed in the display area DA on the substrate 110 will be described in more detail with reference to FIG. 5.

Referring to FIG. 5, the display apparatus 100 according to the exemplary embodiment of the present disclosure may have a structure in which the substrate layer SUB, a transistor layer TRL on the substrate layer SUB, a planarization layer PLN on the transistor layer TRL, a light emitting element layer EDL on the planarization layer PLN, the encapsulation layer ENCAP on light emitting element layer EDL, the touch sensing layer TSL on the encapsulation layer ENCAP, and the color filter layer CFL on the touch sensing layer TSL are sequentially laminated. In this case, a protection layer, an organic layer, a polarization layer, and a cover layer may be further disposed on the color filter layer CFL of the display apparatus 100.

FIG. 5 illustrates, as an example, two sub pixels that emit light in different wavelength ranges among the plurality of sub pixels SP disposed in the display area DA. However, other sub pixels that emit light in different wavelength ranges may have the same structure except light output from light emitting stacks of the light emitting elements 200.

The substrate layer SUB includes the substrate 110 that serves to support and protects components of the display apparatus disposed thereon.

For example, when the substrate 110 is made of polyimide (PI), moisture may pass through the substrate 110 made of PI to permeate the thin film transistor or the light emitting element so that the performance of the display apparatus 100 may deteriorate. The display apparatus 100 according to the exemplary embodiment of the present disclosure may use a double PI structure as the substrate 110 to suppress the deterioration in performance of the display apparatus 100 caused by the moisture permeation.

For example, the substrate 110 may include a first substrate and a second substrate each made of PI, and an inorganic insulating layer disposed between the first substrate and the second substrate. The inorganic insulating layer may be configured by a single layer of silicon nitride (SiNx) or silicon oxide (SiOx) or a multi-layer thereof. For example, the inorganic insulating layer may be made of a silicon dioxide ($SiO_2$) material but is not limited thereto. The inorganic insulating layer may be configured by a double layer of $SiO_2$ and SiNx. The inorganic insulating layer serves to block the permeation of moisture onto the second substrate. Also, when charges are charged in the first substrate, the inorganic insulating layer may block the effect of the charged charges on a thin film transistor 300 through the second substrate. Since the charges charged in the lower PI are blocked by the inorganic insulating layer, the reliability of the product performance may be improved. Further, a separate process of forming a metal layer to block the charges may be omitted, and, thus, the overall process may be simplified, and the production cost may be reduced.

The substrate layer SUB may also include a buffer layer 120 disposed on the substrate 110.

For example, the buffer layer 120 may include a multi-buffer layer disposed on the substrate 110 and an active buffer layer disposed on the multi-buffer layer. A metal layer serving as a light shield may be further disposed between the multi-buffer layer and the active buffer layer. The metal layer may also be referred to as a light shielding layer.

A thin film transistor including a driving transistor Td and at least one switching transistor Ts, various patterns for forming at least one capacitor, various insulating films, and various metal patterns may be disposed in the transistor layer TRL.

Referring to FIG. 5, the thin film transistor 300 may be disposed on the buffer layer 120. The thin film transistor 300 may include an active layer 310, a gate electrode 330, a source electrode 350, and a drain electrode 370. FIG. 5 illustrates that the drain electrode 370 of the thin film transistor 300 is electrically connected to an anode (or first electrode) 210 of the light emitting element 200 to be described below. However, the present disclosure is not limited thereto. That is, depending on the design of the pixel driving circuit, the source electrode 350 may serve as a drain electrode and the drain electrode 370 may serve as a source electrode.

The active layer 310 of the thin film transistor 300 may include a channel region in which a channel is formed when the thin film transistor 300 is driven, and a source region and a drain region on both sides of the channel region. The source region of the active layer 310 is connected to the source electrode 350, and the drain region is connected to the drain electrode 370. For example, the source region and the drain region may be configured by ion-doping (impurity doping) of the active layer 310. The source region and the drain region may be generated by doping ions into a polysilicon material. The channel region may refer to a portion in which the ions are not doped, but the polycrystalline silicon material remains. However, the present disclosure is not limited thereto.

A gate insulating layer 130 is disposed on the active layer 310. The gate insulating layer 130 may be disposed on the entire substrate 110 including the active layer 310. For example, the gate insulating layer 130 may be configured by a single layer of silicon nitride (SiNx) or silicon oxide (SiOx) or a multi-layer thereof. The gate insulating layer 130 may include contact holes. The contact holes serve to connect the source electrode 350 and the drain electrode 370 of the thin film transistor 300 to the source region and the drain region, respectively, of the active layer 310 of the thin film transistor 300.

The gate electrode 330 of the thin film transistor 300 is disposed on the gate insulating layer 130. For example, the gate electrode 330 may be formed by a single layer of any one of molybdenum (Mo), copper (Cu), titanium (Ti), aluminum (Al), chrome (Cr), gold (Au), nickel (Ni), and neodymium (Nd) or an alloy thereof, or a multi-layer thereof. The gate electrode 330 may be formed on the gate insulating layer 130 so as to overlap the channel region of the active layer 310 of the thin film transistor 300.

An interlayer insulating layer 140 is disposed on the gate electrode 330. For example, the interlayer insulating layer 140 may be configured by a single layer of silicon nitride (SiNx) or silicon oxide (SiOx) or a multi-layer thereof. The interlayer insulating layer 140 may include contact holes for exposing the source region and the drain region of the active layer 310 of the thin film transistor 300.

A first inorganic layer 150 may be disposed on the interlayer insulating layer 140. The first inorganic layer 150 may be a passivation layer for protecting the thin film transistor 300 and may be omitted. For example, the first inorganic layer 150 may be made of silicon nitride (SiNx) or silicon oxide (SiOx) or configured by a double layer thereof.

A planarization layer 160 composed of at least one layer is disposed in the planarization layer PLN. The planarization layer 160 may be an organic layer which planarizes and protects upper portions of the thin film transistor 300. For example, the planarization layer 160 may be made of an organic material such as acryl resin, epoxy resin, phenolic resin, polyamide resin, or polyimide resin.

The light emitting element 200 disposed in the light emitting element layer EDL includes the anode 210, a light emitting layer 220, and a cathode (or second electrode) 230. Further, the bank 400 disposed in the light emitting element layer EDL defines emission areas of the plurality of sub pixels SP. For example, referring to FIG. 6, the bank 400 may include the opening OA_BK for exposing a portion corresponding to an emission area of the sub pixel SP.

The anode 210 of the light emitting element 200 is disposed on the planarization layer 160. The anode 210 may be made of a metallic material and may be electrically connected to the thin film transistor 300 through the contact hole formed in the planarization layer 160. For example, when the display apparatus 100 according to the exemplary embodiment of the present disclosure is a top emission type, light emitted from the light emitting element 200 is emitted to above the substrate 110. In this case, the anode 210 may further include a transparent conductive layer and a reflective layer on the transparent conductor layer. For example, the transparent conductive layer may be made of a transparent conductive oxide such as ITO or IZO, and the reflective layer may be made of silver (Ag), aluminum (Al), gold (Au), molybdenum (Mo), tungsten (W), chrome (Cr), or an alloy thereof.

The bank 400 may be disposed to cover both ends of the anode 210, a part of the anode 210 may be exposed through the opening OA_BK of the bank 400. For example, the bank 400 may be made of an inorganic insulating material, such as silicon nitride (SiNx) or silicon oxide (SiOx), or an organic insulating material, such as benzocyclobutene resin, acrylic resin, or imide resin, but is not limited thereto. A spacer may be further disposed on the bank 400.

The light emitting layer 220 of the light emitting element 200 is disposed on and around the opening OA_BK of the bank 400. Therefore, the light emitting layer 220 may be disposed on the anode 210 exposed through the opening OA_BK of the bank 400. For example, the light emitting layer 220 may include a plurality of organic films. The cathode 230 is disposed on the light emitting layer 220 of the light emitting element 200.

An encapsulation layer 500 having a single layer structure or a multi-layered structure is disposed in the encapsulation layer ENCAP on the light emitting element layer EDL. For example, as shown in FIG. 5, the encapsulation layer 500 may include a first encapsulation layer 510, a second encapsulation layer 520, and a third encapsulation layer 530. Herein, the first encapsulation layer 510 and the third encapsulation layer 530 may be configured by inorganic films, and the second encapsulation layer 520 may be configured by an organic film. Among the first encapsulation layer 510, the second encapsulation layer 520, and the third encapsulation layer 530, the second encapsulation layer 520 is thickest and may serve as a planarization layer.

The first encapsulation layer 510 may be disposed to be most adjacent to the light emitting element 200. That is, the first encapsulation layer 510 may be disposed on the cathode 230 of the light emitting element layer EDL. The first encapsulation layer 510 may be made of an inorganic insulating material on which low-temperature deposition can be performed. For example, the first encapsulation layer 510 may be configured by silicon nitride (SiNx), silicon oxide (SiOx), silicon oxynitride (SiON), aluminum oxide ($Al_2O_3$), or the like. The first encapsulation layer 510 is deposited under a low temperature atmosphere. Thus, during the deposition process, it is possible to suppress damage to the light emitting layer 200 including an organic material which is vulnerable to high temperature atmosphere.

The second encapsulation layer 520 may be formed to have a smaller area than the first encapsulation layer 510. In this case, the second encapsulation layer 520 may be formed to expose both ends of the first encapsulation layer 510. The second encapsulation layer 520 may serve as a buffer to relieve stress between layers caused by bending of the flexible display apparatus and serve to enhance planarization performance. For example, the second encapsulation layer 520 may be made of an organic insulating material such as acrylic resin, epoxy resin, polyimide, polyethylene, or silicon oxycarbon (SiOC). For example, the second encapsulation layer 520 may be formed by an inkjet method. However, the present disclosure is not limited thereto.

The third encapsulation layer 530 may be formed on the substrate 110 on which the second encapsulation layer 520 is formed so as to cover upper and side surfaces of each of the second encapsulation layer 520 and the first encapsulation layer 510. In this case, the third encapsulation layer 530 may minimize or block the permeation of external moisture or oxygen into the first encapsulation layer 510 and the second encapsulation layer 520. For example, the third encapsulation layer 530 may be configured by an inorganic insulating material, such as silicon nitride (SiNx), silicon oxide (SiOx), silicon oxynitride (SiON), or aluminum oxide ($Al_2O_3$). As shown in FIG. 2, at least one dam 117 may be disposed in the non-display area NA to block the flow of the second encapsulation layer 520 of the encapsulation layer 500.

The touch sensing unit is disposed in the touch sensing layer TSL on an upper portion of the encapsulation layer ENCAP. The touch sensing unit includes a plurality of touch electrodes and a plurality of bridge electrodes. As described above with reference to FIG. 4, the touch sensing unit includes the plurality of first touch electrodes TE1 extending in the first direction. Also, the touch sensing unit includes the plurality of second touch electrodes TE2 extending in the second direction which intersects the first direction. Each of the plurality of first touch electrodes TE1 and the plurality of second touch electrodes TE2 may include a plurality of unit electrodes. For example, each of the first touch electrode TE1 and the second touch electrode TE2 may include a plurality of unit electrodes patterned in a mesh form. Also, the touch sensing unit includes the first bridge electrode BE1 configured to electrically connect the unit electrodes of the first touch electrode TE1. Further, the touch sensing unit includes the second bridge electrode BE2 configured to electrically connect the unit electrodes of the second touch electrode TE2. Herein, the first touch electrode TE1 and the first bridge electrode BE1 are disposed on different layers, and the first bridge electrode BE1 is disposed on an upper layer of the first touch electrode TE1. Alternatively, the second touch electrode TE2 and the second bridge electrode BE2 may be disposed on the same layer.

Referring to FIG. 5, a touch insulating layer 600 including insulating films for placing the touch sensing unit is disposed on the encapsulation layer 500. Herein, a touch buffer layer 610 is disposed on the third encapsulation layer 530, and the first touch electrode TE1 is disposed on the touch buffer layer 610. The second touch electrode TE2 may also be disposed on the touch buffer layer 610.

The touch buffer layer 610 may suppress damage to the light emitting layer 220 containing a material which is vulnerable to chemicals or moisture. When the touch sensing layer TSL is formed, chemicals (for example, developer, etchant, etc.) used for the process, moisture from the outside, or the like may be generated. The touch buffer layer 610 is disposed and the touch sensing unit is disposed thereon. Therefore, it is possible to suppress the permeation of chemicals, moisture, or the like into the light emitting layer 220 containing an organic material during a manufacturing process of the touch sensing unit. Also, the touch buffer layer 610 may suppress damage to the light emitting layer 220 containing an organic material which is vulnerable to a high temperature. Herein, the touch buffer layer 610 may be made of an organic insulating material which can be formed at a temperature lower than a predetermined temperature (for example, 100° C.) and has a low dielectric constant of 1 to 3. For example, the touch buffer layer 610 may be made of an acryl-based, epoxy-based or siloxane-based material. As described above, the touch buffer layer 610 made of an organic insulating material may suppress damage to the encapsulation layer ENCAP caused by bending of the flexible display apparatus. Thus, the touch buffer layer 610 may also suppress the breakage of the plurality of touch electrodes TE1 and TE2 and the plurality of bridge electrodes BE1 and BE2 disposed on the encapsulation layer ENCAP.

A touch interlayer insulating layer 620 is disposed on the first touch electrode TE1 and the touch buffer layer 610, and the first bridge electrode BE1 is disposed on the touch interlayer insulating layer 620. The first touch electrode TE1 may be insulated from the first bridge electrode BE1 by the touch interlayer insulating layer 620. That is, the plurality of first touch electrodes TE1 extending in the first direction may be electrically connected through the bridge electrode BE1 disposed thereon. This is to suppress a short-circuit at intersections of the plurality of touch electrodes disposed in the first direction and the second direction. Herein, the touch interlayer insulating layer 620 may include a contact hole for electrically connecting the first touch electrode TE1 and the first bridge electrode BE1. Also, the touch interlayer insulating layer 620 may be an organic film made of an organic material. However, a material of the touch interlayer insulating layer 620 is not limited thereto. For example, the touch interlayer insulating layer 620 may be an inorganic film made of an inorganic material.

A second inorganic layer 630 is disposed on the first bridge electrode BE1 and the touch interlayer insulating layer 620 so as to cover the touch sensing unit. The second inorganic layer 630 suppresses damage to the electrodes of the touch sensing unit caused by chemicals (for example, developer, etc.) used for upper layer processing or moisture.

Meanwhile, the display apparatus 100 according to the exemplary embodiment of the present disclosure may enhance a touch sensing performance of touch electrodes by increasing a metal density of the plurality of touch electrodes TE1 and TE2. Specifically, the touch sensing performance of the touch sensing unit may be enhanced by increasing the width of touch electrode lines of the touch electrodes TE1 and TE2 or the area of the touch electrodes TE1 and TE2 themselves to increase the metal density of the touch electrodes. For example, at least some of the touch electrode lines TEL1 of the plurality of first touch electrodes TE1 and the touch electrode lines of the plurality of second touch electrodes TE2 may have a width the same or substantially the same as a width between some adjacent openings among a plurality of openings of the black matrix 710. Also, the sum of the width of the bridge electrode BE1 and the widths of touch electrode lines of the unit electrodes of the touch electrodes TE1 connected through the bridge electrode BE1 may be the same or substantially the same as a width between yet other adjacent openings among the plurality of openings of the black matrix 710. Further, the sum of a width of the bridge electrode BE2 and the widths of touch electrode lines of the unit electrodes of the touch electrodes TE2 connected through the bridge electrode BE2 may be the same or substantially the same as a width between still other adjacent openings among the plurality of openings of the black matrix 710. All the plurality of touch electrodes TE1 and TE2 and the plurality of bridge electrodes BE1 and BE2 are disposed under the black matrix 710. Thus, they are not recognized from the outside, and the metal density of the touch electrodes is increased. Accordingly, it is possible to enhance the touch sensing performance of the touch electrodes.

As described above, in the display apparatus 100 according to the exemplary embodiment of the present disclosure, an overlap area between the user's touch input means (for example, a finger or a pen) and the touch electrodes is increased by increasing the metal density of the touch electrodes. Thus, a capacitance formed between the user's touch input means and the touch electrodes is increased. As a result, it is possible to enhance the touch sensing performance of the touch electrodes. FIG. 5 illustrates only the first touch electrode TE1 and the first bridge electrode BE1 to describe the structure of the touch sensing unit including a touch electrode and a bridge electrode disposed on different layers. However, like the first touch electrode TE1, the second touch electrode TE2 may also be increased in metal density.

As shown in FIG. 5, the second inorganic layer 630 configured to shield the touch sensing unit is disposed on a front surface of an uppermost portion of the touch sensing layer TSL. The second inorganic layer 630 serves as a shield layer to minimize damage to the electrodes of the touch sensing unit caused by chemicals (for example, a developer, an etchant, etc.) used for forming the color filter layer CFL, which is an upper layer of the touch sensing layer TSL.

In the display apparatus 100 according to the exemplary embodiment of the present disclosure, the plurality of touch electrodes is designed to maximize the metal density. Therefore, when the plurality of touch electrodes is disposed right under the second inorganic layer 630, an arc fault may occur in the touch electrodes having a high metal density during a process (for example, plasma process) of depositing the second inorganic layer 630 on the touch sensing unit. In order to suppress this problem, the display apparatus 100 according to the exemplary embodiment of the present disclosure includes the plurality of touch electrodes TE1 and TE2 disposed under the touch interlayer insulating layer 620, which is an organic film. Also, the first bridge electrode BE1 having a lower metal density is disposed on the touch interlayer insulating layer 620 and under the second inorganic layer 630. Therefore, it is possible to suppress the occurrence of an arc fault during a process of forming the second inorganic layer 630 and enhance the touch sensing performance.

A plurality of color filters 720 and the black matrix 710 formed between the plurality of color filters 720 on the same layer are disposed in the color filter layer CFL on an upper portion of the touch sensing layer TSL.

As shown in FIG. 5, color filters 720_A and 720_B and the black matrix 710 are disposed on the second inorganic layer 630.

The black matrix 710 is disposed on the second inorganic layer 630 so as to overlap the bank 400, and the plurality of color filters 720 is disposed to overlap a plurality of openings OA_BM of the black matrix 710. Each color filter 720 reduces reflection and recognition of external light incident from the outside into the bank 400 but does not block light emitted from the light emitting element 200. Thus, it is possible to maintain light efficiency. The black matrix 710 is located to overlap an edge of an emission area of the light emitting element 200 and serves to absorb external light incident into the black matrix 710. Thus, it is possible to reduce the amount of external light incident into the emission area and also suppress recognition of reflected light of the external light. The opening OA_BM of the black matrix 710 may overlap the opening OA_BK of the bank 400. Also, the opening OA_BM of the black matrix 710 may have a greater area than the opening OA_BK of the bank 400. In this case, a width of a touch electrode line of each of the touch electrodes TE1 and TE2 may not be greater than and substantially the same as a width between the openings OA_BM of the black matrix 710. That is, the openings OA_BM of the black matrix 710, the opening OA_T of the first touch electrode TE1 and the opening OA_BK of the bank 400 are provided at corresponding positions in a direction perpendicular to the substrate 110. For example, the centers of the openings OA_BM, the opening OA_T and the opening OA_BK may be located on the same line perpendicular to the substrate 110, and the openings OA_BM, the opening OA_T and the opening OA_BK may have corresponding shapes. In an embodiment, a size of the opening OA_T may be greater than or equal to that of the opening OA_BK. In an embodiment, the size of the opening OA_T may be less than but substantially equal to that of the openings OA_BM. In an embodiment, centers of the opening OA_BM and the opening OA_BK overlap each other with a gap formed there between, and the gap may have a circular ring shape or a polygonal ring shape from a plan view.

An insulating layer 730 may be disposed on the black matrix 710 and the plurality of color filters 720, and the insulating layer 730 may be made of an organic material.

In a display apparatus in which the touch sensing unit is disposed on the color filter layer CFL or does not include the color filter layer CFL, external light is reflected by the touch electrodes. Thus, the touch electrodes may be recognized. In this case, the disposition and area of the touch electrodes are limited. However, in the display apparatus 100 according to the exemplary embodiment of the present disclosure, the touch sensing unit is disposed between the encapsulation layer ENCAP and the color filter layer CFL. Also, the touch electrodes of the touch sensing unit are disposed under the black matrix 710. Therefore, the degree of freedom in disposition of the touch electrodes is increased. Thus, the metal density of the touch electrodes can be increased.

In the display apparatus 100 according to the exemplary embodiment of the present disclosure, each of the plurality of first touch electrodes TE1, the plurality of second touch electrodes TE2, and a plurality of first bridge electrodes BE1 disposed on the touch electrodes is disposed to overlap the black matrix 710. In this case, each of the plurality of first touch electrodes TE1 and the plurality of second touch electrodes TE2 may be disposed to be vertically parallel to a part of the black matrix 710. Also, each of the plurality of first touch electrodes TE1 and the plurality of second touch electrodes TE2 may have a width the same or substantially the same as a width between two adjacent openings among the plurality of openings OA_BM of the black matrix 710.

Hereinafter, examples of a touch electrode structure of a display apparatus according to an exemplary embodiment of the present disclosure will be described with reference to FIG. 8 to FIG. 10.

Figure 8:
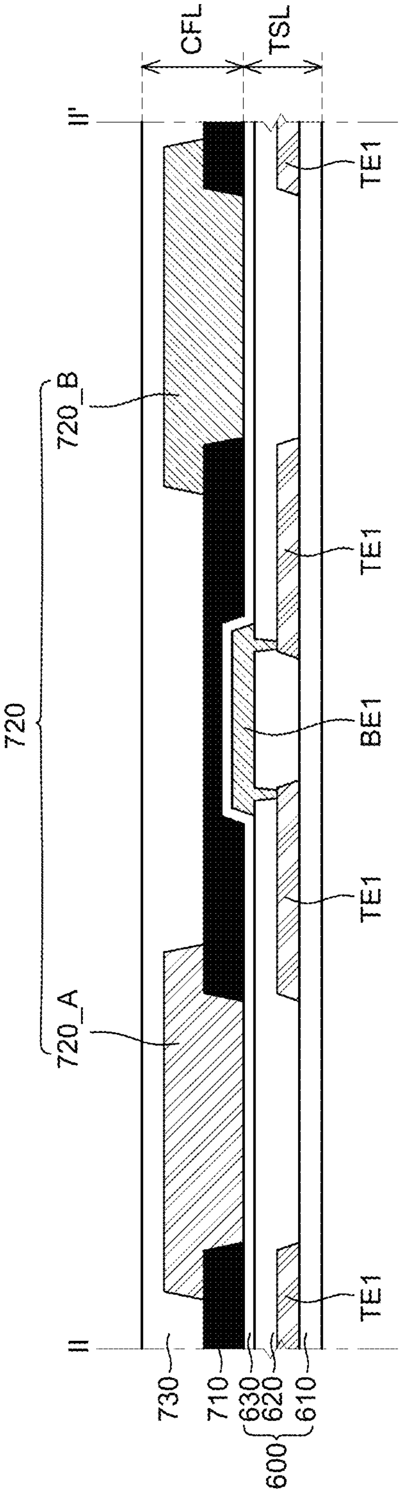
FIG. 8 is a cross-sectional view taken along the line II-II' of FIG. 4 and shows an example of a touch electrode structure of the display apparatus according to an exemplary embodiment of the present disclosure.

FIG. 8 is a cross-sectional view taken along the line II-II' of FIG. 4 and shows an example of a touch electrode structure of the display apparatus according to an exemplary embodiment of the present disclosure. FIG. 9 is a cross-sectional view taken along the line II-II' of FIG. 4 and shows another example of the touch electrode structure of the display apparatus according to an exemplary embodiment of the present disclosure. FIG. 10 is a plan view illustrating an overlap structure of a touch electrode and a dummy electrode in the display apparatus.

FIG. 8 illustrates an example of the touch electrode structure of the display apparatus 100 according to the exemplary embodiment of the present disclosure. In this case, the first touch electrode TE1 and the first bridge electrode BE1 disposed thereon are electrically connected to each other through the contact hole of the touch interlayer insulating layer 620. Herein, a touch electrode line of the first touch electrode TE1 may have a width the same or substantially the same as a width between openings of the black matrix 710. Thus, it is possible to increase a capacitance for touch sensing by increasing a metal density of touch electrodes and enhance a touch sensing performance. Also, the bridge electrode having a lower metal density of touch electrodes is disposed under the second inorganic layer 630. Thus, it is possible to suppress the occurrence of an arc fault during a process of depositing the second inorganic layer 630.

Figure 9:
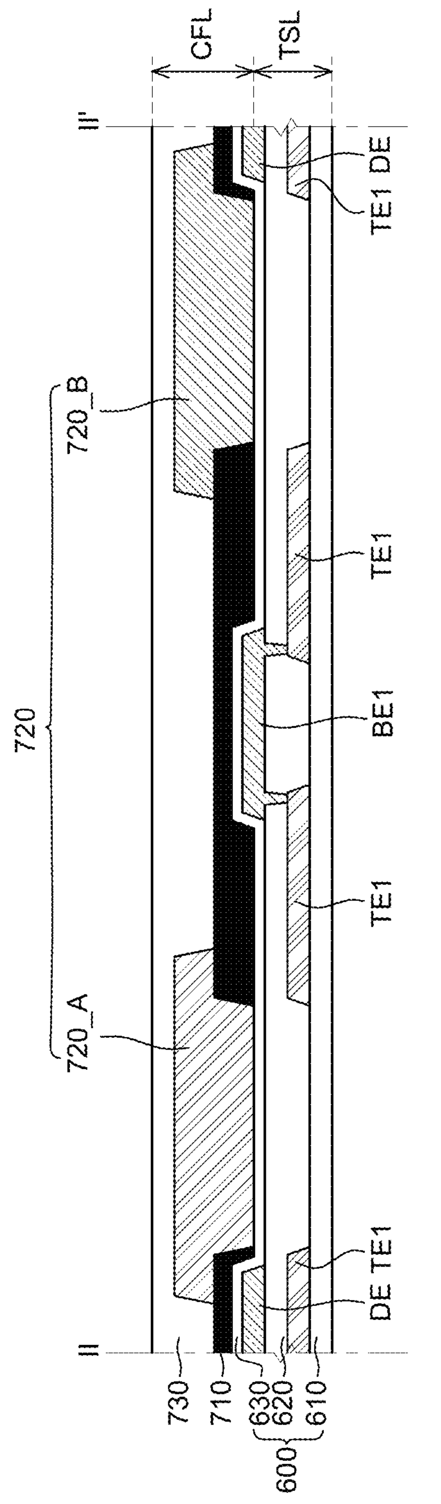
FIG. 9 is a cross-sectional view taken along the line II-II' of FIG. 4 and shows another example of the touch electrode structure of the display apparatus according to an exemplary embodiment of the present disclosure.

FIG. 9 illustrates another example of the touch electrode structure of the display apparatus according to the exemplary embodiment of the present disclosure. In this case, a dummy electrode DE may be disposed on a part of the first touch electrode TE1 which is not connected to the first bridge electrode BE1. The dummy electrode DE is disposed on the same layer as the first bridge electrode BE1.

As shown in FIG. 9, the dummy electrode DE is disposed on an upper layer of the first touch electrode TE1 so as to overlap the first touch electrode TE1. However, the present disclosure is not limited thereto. In another embodiment the dummy electrode DE is disposed under the first touch electrode TE1. For example, the dummy electrode DE formed in a mesh shape and overlapping the first touch electrode TE1 and the second electrode TE2 may be disposed under the black matrix 710. Accordingly, a double electrode structure including the dummy electrode DE and the first touch electrode TE1 is formed, and a fringe electric field effect occurs. Due to the double electrode structure including the dummy electrode DE and the first touch electrode TE1, a capacitance formed between the user's touch input means (for example, a finger or a pen) and the touch electrodes is increased. As a result, it is possible to further enhance the touch sensing performance. FIG. 9 illustrates an example where the dummy electrode DE is disposed on the first touch electrode TE1. However, the dummy electrode DE may also be disposed on the second touch electrode TE2.

The positions and number of dummy electrodes DE corresponding to the first touch electrode TE1 or the second touch electrode TE2 are not limited. However, the dummy electrode DE may be locally disposed to suppress the occurrence of an arc fault during the process of depositing the second inorganic layer 630. That is, the dummy electrode DE may be disposed to correspond to all or some of the plurality of first touch electrodes TE1 and the plurality of second touch electrodes TE2.

Further, at least one of the first touch electrode TE1 and the second touch electrode TE2 may be electrically insulated from the dummy electrode DE disposed thereon by the touch interlayer insulating layer 620. In this case, the dummy electrode DE may be floated.

Figure 10:
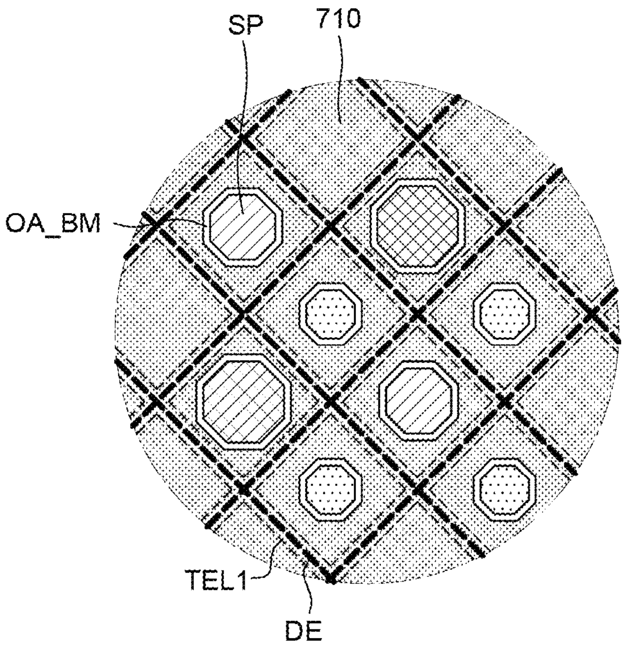
FIG. 10 is a plan view illustrating an overlap structure of a touch electrode and a dummy electrode in the display apparatus.

Referring to FIG. 10, the dummy electrode DE may be formed to have a smaller width than the first touch electrode TE1 and the second touch electrode TE2. FIG. 10 illustrates an example where dummy electrodes DE are sequentially disposed on the first touch electrode lines TEL1 constituting the unit electrodes of the first touch electrode TE1. However, the dummy electrodes DE may be locally disposed on the unit electrodes of the touch electrodes or may be regularly or randomly disposed on the unit electrodes of the touch electrode. Also, a plurality of unit electrodes constituting a touch electrode may include a unit electrode on which the dummy electrode DE is not disposed, and there may be a touch electrode on which the dummy electrode DE is not disposed.

As shown in FIG. 10, the dummy electrode DE having a smaller width than the first touch electrode TE1 and the second touch electrode TE2 is disposed under the inorganic layer 630. Thus, it is possible to suppress the occurrence of an arc fault during the process of depositing the inorganic layer 630. Also, it is possible to further enhance the touch sensing performance.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:

a substrate including a display area and a non-display area;

a light emitting element layer on the substrate in the display area;

an encapsulation layer on the light emitting element layer;

a touch sensing layer on the encapsulation layer;

a color filter layer comprising a black matrix having a plurality of first openings on the touch sensing layer;

a gate driving circuit on the substrate in the non-display area;

a dam on the substrate in the non-display area and around the display area;

a panel crack detector disposed at an edge portion of the substrate in the non-display area, wherein the dam is located between the gate driving circuit and the panel crack detector from a plan view, wherein the touch sensing layer comprises;

a plurality of first touch electrodes;

a touch interlayer insulating layer made of an organic material and disposed on the plurality of the first touch electrodes;

a plurality of first bridge electrodes connecting the adjacent first touch electrodes and disposed on the touch interlayer insulating layer; and an inorganic layer disposed on the plurality of first bridge electrodes, wherein a metal density of the plurality of first touch electrodes is higher than a metal density of the plurality of first bridge electrodes, wherein a difference in the metal density of the plurality of first touch electrodes and the metal density of the plurality of first bridge electrodes is configured to suppress an occurrence of an arc fault during formation of the second inorganic layer, and wherein a sum of a width of one of the plurality of first bridge electrodes and widths of the plurality of first touch electrodes connected through the first bridge electrode is same as a width between adjacent two openings of the plurality of the first openings of the black matrix.

2. The display apparatus according to claim 1, wherein the touch sensing layer further comprises a plurality of second touch electrodes.

3. The display apparatus according to claim 2, wherein a plurality of color filters respectively covering the plurality of the first openings.

4. The display apparatus according to claim 3, wherein the plurality of second touch electrodes are disposed under the black matrix.

5. The display apparatus according to claim 1, wherein the light emitting element layer comprises a plurality of sub pixels and a bank layer including a plurality of second openings defining emission areas of the plurality of sub pixels, and wherein the first opening and the second opening have corresponding shapes, and a size of the first opening is greater than or equal to that of the second opening.

6. The display apparatus according to claim 2, wherein the touch sensing layer further comprises a second bridge electrode configured to electrically connect adjacent second touch electrodes.

7. The display apparatus according to claim 6, wherein the plurality of second touch electrodes and second bridge electrode are integrally formed on a same layer.

8. The display apparatus according to claim 5, wherein, in a top view, centers of a first opening and a second opening overlap each other with a gap formed there between.

9. The display apparatus according to claim 8, wherein the gap has a circular ring shape or a polygonal ring shape from a plan view.

10. The display apparatus according to claim 5, wherein the plurality of first touch electrodes and the plurality of second touch electrodes are formed in a mesh shape including a plurality of third openings, wherein, in a top view, the plurality of sub pixels is located in the plurality of third openings, and wherein, in a top view, the sub pixel is not located in at least one of the plurality of third openings.

11. The display apparatus according to claim 2, further comprising a dummy electrode formed in a mesh shape, and wherein, in a top view, the dummy electrode overlaps the plurality of first touch electrodes and the plurality of second touch electrodes.

12. The display apparatus according to claim 1, wherein the plurality of first touch electrodes are separated from the inorganic layer by the touch interlayer insulating layer, and wherein, in a cross-section taken perpendicular to the substrate, at least a portion of the plurality of first bridge electrodes and the inorganic layer extends into a thickness region occupied by the black matrix.

13. A display apparatus, comprising:

a substrate including a display area and a non-display area;

a light emitting element layer on the substrate in the display area;

an encapsulation layer on the light emitting element layer;

a color filter layer on the encapsulation layer;

a touch sensing layer between the encapsulation layer and the color filter layer;

wherein the touch sensing layer comprises:

a plurality of first touch electrodes;

a touch interlayer insulating layer made of an organic material and disposed on the plurality of the first touch electrodes;

a plurality of first bridge electrodes connecting adjacent first touch electrodes of the plurality and disposed on the touch interlayer insulating layer; and an inorganic layer disposed on the plurality of first bridge electrodes, wherein the plurality of first touch electrodes are separated from the inorganic layer by the touch interlayer insulating layer, wherein a metal density of the plurality of first touch electrodes is higher than a metal density of the plurality of first bridge electrodes, and wherein a difference in the metal density of the plurality of first touch electrodes and the metal density of the plurality of first bridge electrodes is configured to suppress an occurrence of an arc fault during forming of the second inorganic layer.

14. The display apparatus according to claim 13, further comprising:

a dummy electrode disposed to overlap at least one of the plurality of first touch electrodes and electrically insulated therefrom, wherein the dummy electrode has a smaller width than the plurality of first touch electrodes.

15. The display apparatus according to claim 13, further comprising:

a dummy electrode disposed on the touch interlayer insulating layer and locally overlapping a portion of the plurality of first touch electrodes not connected to the first bridge electrodes, wherein the inorganic layer is disposed on the dummy electrode.

16. The display apparatus according to claim 13, further comprising a black matrix on the touch sensing layer and arranged laterally with respect to color filters of the color filter layer, wherein at least a portion of the plurality of first bridge electrodes and the inorganic layer extends into the black matrix in a thickness direction, and wherein the black matrix fully overlaps, in a plan view, a sum of a width of one of the plurality of first bridge electrodes and widths of the plurality of first touch electrodes connected through the first bridge electrode.

17. A display apparatus, comprising:

a substrate including a display area and a non-display area;

a light emitting element layer on the substrate in the display area;

an encapsulation layer on the light emitting element layer;

a touch sensing layer on the encapsulation layer;

a color filter layer comprising a black matrix having a plurality of first openings on the touch sensing layer;

a gate driving circuit on the substrate in the non-display area;

a dam on the substrate in the non-display area and around the display area;

a panel crack detector disposed at an edge portion of the substrate in the non-display area, wherein the dam is located between the gate driving circuit and the panel crack detector from a plan view, wherein the touch sensing layer comprises:

a plurality of first touch electrodes;

a touch interlayer insulating layer made of an organic material and disposed on the plurality of the first touch electrodes;

a plurality of first bridge electrodes connecting the adjacent first touch electrodes and disposed on the touch interlayer insulating layer; and an inorganic layer disposed on the plurality of first bridge electrodes, wherein a sum of a width of one of the plurality of first bridge electrodes and widths of the plurality of first touch electrodes connected through the first bridge electrode is same as a width between adjacent two openings of the plurality of the first openings of the black matrix, wherein the plurality of first touch electrodes are separated from the inorganic layer by the touch interlayer insulating layer, and wherein, in a cross-section taken perpendicular to the substrate, at least a portion of the plurality of first bridge electrodes and the inorganic layer extends into a thickness region occupied by the black matrix.

* * * * *